United States Patent
Okonogi et al.

(10) Patent No.: US 8,783,230 B2
(45) Date of Patent: Jul. 22, 2014

(54) FUEL INJECTION SYSTEM FOR INTERNAL-COMBUSTION ENGINE AND METHOD OF CONTROLLING FUEL INJECTION SYSTEM FOR INTERNAL-COMBUSTION ENGINE

(75) Inventors: Atsushi Okonogi, Hitachinaka (JP);
Masahiro Toyohara, Hitachiota (JP);
Takashi Okamoto, Hitachinaka (JP);
Motoyuki Abe, Mito (JP); Takuya Mayuzumi, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 739 days.

(21) Appl. No.: 13/034,195

(22) Filed: Feb. 24, 2011

(65) Prior Publication Data

US 2011/0220067 A1 Sep. 15, 2011

(30) Foreign Application Priority Data

Mar. 9, 2010 (JP) ................................ 2010-051429

(51) Int. Cl.
*F02D 41/30* (2006.01)
*H03K 17/64* (2006.01)
*F02D 41/20* (2006.01)

(52) U.S. Cl.
CPC ................ *F02D 41/30* (2013.01); *H03K 17/64* (2013.01); *F02D 2041/2003* (2013.01)
USPC .......................................... 123/480; 123/478

(58) Field of Classification Search
USPC ........................... 123/472, 478, 480, 490, 492
See application file for complete search history.

(56) References Cited

U.S. PATENT DOCUMENTS

| | | | | |
|---|---|---|---|---|
| 5,161,510 A * | 11/1992 | Yamada | ......................... | 123/494 |
| 5,515,830 A * | 5/1996 | Arakowa | ......................... | 123/490 |
| 6,076,508 A * | 6/2000 | Nakano | ......................... | 123/490 |
| 6,526,945 B2 * | 3/2003 | Herzog et al. | ................ | 123/490 |
| 6,571,773 B1 | 6/2003 | Yamakado et al. | | |
| 7,778,765 B2 | 8/2010 | Toyohara et al. | | |
| 2002/0189593 A1* | 12/2002 | Yamakado et al. | ........... | 123/490 |
| 2003/0010325 A1* | 1/2003 | Reischl et al. | ................ | 123/490 |
| 2003/0062029 A1* | 4/2003 | Oyama et al. | ................ | 123/490 |

(Continued)

FOREIGN PATENT DOCUMENTS

| | | |
|---|---|---|
| EP | 0 212 777 A2 | 3/1987 |
| EP | 2 042 716 A1 | 4/2009 |

(Continued)

OTHER PUBLICATIONS

Japanese Office Action including English translation dated Oct. 30, 2012 (Five (5) pages).

(Continued)

*Primary Examiner* — Hieu T Vo
*Assistant Examiner* — Arnold Castro
(74) *Attorney, Agent, or Firm* — Crowell & Moring LLP (57) ABSTRACT

Disclosed is a fuel injection system that is used with an internal-combustion engine to reliably perform a requested fuel injection operation a requested number of times even when a boost voltage is lowered. The fuel injection system monitors the boost voltage immediately before the start of fuel injection, and varies a valve open time in accordance with the monitored boost voltage. Even when the boost voltage is lowered, the fuel injection system performs a fuel injection operation the requested number of times.

16 Claims, 7 Drawing Sheets

(56) References Cited

U.S. PATENT DOCUMENTS

| | | | |
|---|---|---|---|
| 2003/0183204 A1* | 10/2003 | Vierling et al. | 123/490 |
| 2009/0183714 A1* | 7/2009 | Mayuzumi | 123/490 |
| 2009/0217914 A1* | 9/2009 | Casasso | 123/490 |
| 2010/0242920 A1* | 9/2010 | Omori et al. | 123/490 |

FOREIGN PATENT DOCUMENTS

| | | |
|---|---|---|
| EP | 2 075 446 A2 | 7/2009 |
| EP | 2 083 159 A1 | 7/2009 |
| JP | 6-280658 A | 10/1994 |
| JP | 10-266885 A | 10/1998 |
| JP | 2001-41085 A | 2/2001 |
| JP | 2001-221121 A | 8/2001 |
| JP | 2003-106200 | 4/2003 |
| JP | 2003-161193 A | 6/2003 |
| JP | 2003-201900 A | 7/2003 |
| JP | 2004-92573 | 3/2004 |
| JP | 2005-330934 A | 12/2005 |
| JP | 2006-336568 A | 12/2006 |
| JP | 2007-327408 A | 12/2007 |
| JP | 2009-24662 | 2/2009 |
| JP | 2009-85043 A | 4/2009 |
| JP | 2009-162114 A | 7/2009 |

OTHER PUBLICATIONS

Japanese Office Action with partial english translation dated May 8, 2012 (four (4) pages).
European Search Report dated Sep. 30, 2013 (five (5) pages).
Japanese Office Action with English Translation dated Jul. 24, 2012 (four (4) pages).

* cited by examiner

FUEL INJECTION SYSTEM FOR INTERNAL-COMBUSTION ENGINE AND METHOD OF CONTROLLING FUEL INJECTION SYSTEM FOR INTERNAL-COMBUSTION ENGINE

CLAIM OF PRIORITY

The present application claims priority from Japanese Patent Application No. 2010-051429 filed on Mar. 9, 2010, the content of which is hereby incorporated by reference into this application.

BACKGROUND OF THE INVENTION

1. Field of the Invention

The present invention relates to a fuel injection system for an internal-combustion engine and a method of controlling a fuel injection system for an internal-combustion engine.

2. Description of the Related Art

In a conventional fuel injection system for an internal-combustion engine, a fuel injector having an electromagnetically-driven fuel injection valve injects fuel a multiple number of times in each operation cycle of a cylinder (provides multiple injection) for the purpose of supplying the fuel to a combustion chamber.

A multiple injection control technology disclosed, for instance, in JP-A No. 201900/2003 provides main injection for main torque generation, pre-injection for torque reinforcement, and post-injection for gas treatment. This technology also checks whether at least one predefined condition is met. If no such condition is met, this technology decreases the number of multiple injections in accordance with priority given to multiple injection and adjusts fuel injection conditions to achieve highly reliable multiple injection.

However, while the demand for multiple injection is increasing year by year, the reinforcement of a control circuit used in a fuel injection system is limited by cost considerations. It is therefore necessary to avoid an increase in the cost of circuit configuration and provide the required number of multiple injections without sacrificing present injection characteristics.

The present invention has been made in view of the above circumstances, and provides a fuel injection system that has a simple configuration and is capable of basically providing the required number of multiple injections or gradually decreasing the number of multiple injections even when the levels of setup conditions and parameters required for fuel injection are lowered. The present invention also provides a method of controlling such a fuel injection system.

SUMMARY OF THE INVENTION

According to one aspect of the present invention, there is provided a fuel injection system for an internal-combustion engine having a fuel injection valve electromagnetically driven to provide multiple fuel injection to a combustion chamber of the internal-combustion engine, an engine control unit for providing drive control of the fuel injection valve, and a battery, the fuel injection system including a booster circuit, a boost voltage driver, a driver IC, and a controller.

The booster circuit boosts the voltage of the battery to generate a boost voltage for the engine control unit. The boost voltage driver uses the boost voltage to control the valve open time Pi of the fuel injection valve. The driver IC drives the booster circuit and the boost voltage driver. The controller transmits a command signal to the boost voltage driver through the driver IC for the purpose of extending the valve open time Pi when the boost voltage of the booster circuit is below a predefined normal voltage.

According to another aspect of the present invention, there is provided a method of controlling a fuel injection system for an internal-combustion engine having a fuel injection valve electromagnetically driven to provide multiple fuel injection to a combustion chamber of the internal-combustion engine, an engine control unit for providing drive control of the fuel injection valve, and a battery, the method including the steps of: causing the engine control unit to monitor a boost voltage obtained by boosting the voltage of the battery; and extending the valve open time Pi of the fuel injection valve to obtain a drive current necessary for operating the fuel injection valve when the boost voltage is below a predefined normal voltage.

The fuel injection system according to an embodiment of the present invention is for use with an internal-combustion engine having a fuel injection valve electromagnetically driven to provide multiple fuel injection to a combustion chamber of the internal-combustion engine, an engine control unit for providing drive control of the fuel injection valve, and a battery, and includes the booster circuit that boosts the voltage of the battery to generate a boost voltage for the engine control unit, the boost voltage driver that uses the boost voltage to control the valve open time Pi of the fuel injection valve, the driver IC that drives the booster circuit and the boost voltage driver, and the controller that transmits a command signal to the boost voltage driver through the driver IC for the purpose of extending the valve open time Pi when the boost voltage of the booster circuit is below a predefined normal voltage.

Being configured as described above, the fuel injection system functions as a highly reliable fuel injection system by providing the maximum possible number of injections to comply with a request even when the boost voltage is lowered.

DETAILED DESCRIPTION OF THE INVENTION

Embodiments of the present invention will now be described with reference to the accompanying drawings.

First Embodiment (1) Configuration of Internal-Combustion Engine System

Figure 1:
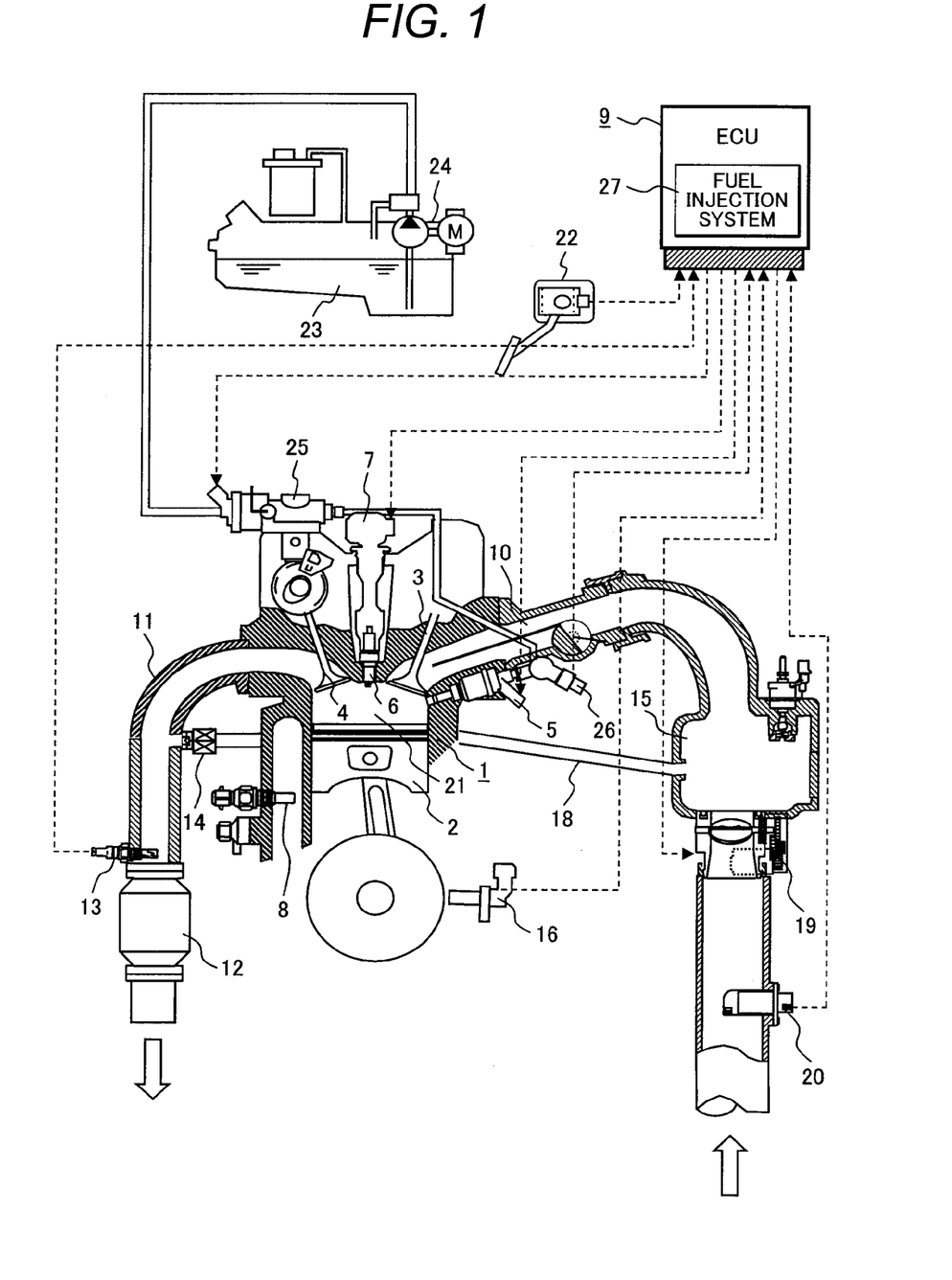
FIG. 1 is a schematic diagram illustrating an overview of a fuel injection system.

First of all, the configuration of an internal-combustion engine system, which includes a fuel injection control circuit according to a first embodiment of the present invention, will be described with reference to FIG. 1. An engine 1 includes a piston 2, an intake valve 3, and an exhaust valve 4. The reference numeral 8 denotes a water temperature sensor. Intake air passes through an air flow meter (AFM) 20, enters a throttle valve 19, and is supplied to a combustion chamber 21 of the engine 1 from a collector 15, which is a branch section, through an intake pipe 10 and the intake valve 3.

A low-pressure fuel pump 24 supplies fuel from a fuel tank 23 to the internal-combustion engine. A high-pressure fuel pump 25 raises the pressure of the fuel to a level required for fuel injection. After being raised to the required pressure by the high-pressure fuel pump 25, the fuel is injected into the combustion chamber 21 of the engine 1 from a fuel injection valve 5 having an electromagnetic coil, and ignited by an ignition plug 6 and an ignition coil 7. A fuel pressure sensor 26 measures the pressure of the fuel. Exhaust gas derived from combustion of the fuel is discharged into an exhaust pipe 11 through the exhaust valve 4. The exhaust pipe 11 is provided with a three-way catalyst 12 for exhaust gas purification.

An engine control unit (hereinafter referred to as the ECU) 9 includes a fuel injection control circuit 27, which receives various input signals such as a signal of a crank angle sensor 16 of the engine 1, an air amount signal of the AFM 20, a signal of an oxygen sensor 13 for detecting the oxygen concentration in the exhaust gas, an accelerator opening signal of an accelerator opening sensor 22, and a signal of the fuel pressure sensor 26.

The ECU 9 not only calculates the torque required of the engine 1 from the accelerator opening signal of the accelerator opening sensor 22, but also judges, for instance, whether or not the engine 1 is idle. The ECU 9 includes an engine speed detector (not shown) that calculates an engine speed from the signal of the crank angle sensor 16. Further, the ECU 9 calculates an intake air amount required for the engine 1, and outputs an appropriate opening signal to the throttle valve 19.

The fuel injection control circuit 27 calculates a fuel amount in accordance with the intake air amount, outputs a drive current that causes the fuel injection valve 5 to inject the fuel, and outputs an ignition signal to the ignition plug 6 and ignition coil 7.

An EGR (exhaust gas recirculation) path 18 connects the exhaust pipe 11 to the collector 15. An EGR valve 14 is installed in the middle of the EGR path 18. The ECU 9 controls the opening of the EGR valve 14 so that the exhaust gas in the exhaust pipe 11 flows back to the intake pipe 10 for recombustion purposes.

(2) ECU and Fuel Injection Control Circuit

Figure 2:
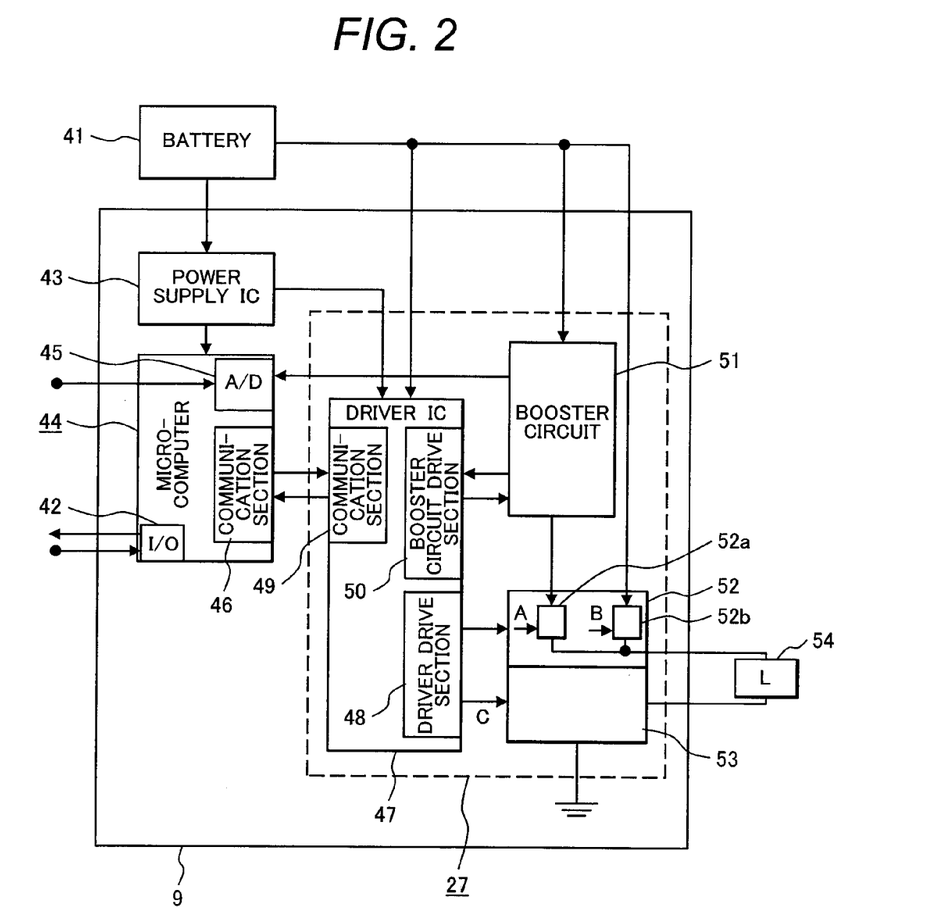
FIG. 2 is a block diagram illustrating an engine control unit according to a first embodiment of the present invention.

FIG. 2 is a block diagram illustrating the ECU 9. The fuel injection control circuit 27, which is incorporated in the ECU 9, includes a driver IC 47, a booster circuit 51, an upper driver 52, and a lower driver 53.

A battery voltage generated from a battery 41 is supplied to the ECU 9 and then forwarded to a power supply IC 43. The battery voltage is also supplied to various other sections such as the driver IC 47 in the fuel injection control circuit 27 and the booster circuit 51 and upper driver 52 for driving a fuel injection system. The power supply IC 43 supplies a voltage, for instance, to a microcomputer 44, which functions as a controller, and to the driver IC 47.

The driver IC 47 in the fuel injection control circuit 27 includes a communication section 49 for communicating with the microcomputer 44, a booster circuit drive section 50, and a driver drive section 48. The booster circuit drive section 50 transmits a switching signal to the booster circuit 51 so that a voltage boosted by the booster circuit 51 is supplied to the upper driver 52. Further, the voltage boosted by the booster circuit 51 is fed back to the booster circuit drive section 50 in the driver IC 47. This causes the driver IC 47 to determine whether or not to retransmit a switching signal.

The voltage boosted by the booster circuit 51 is also fed back to an A/D converter 45 in the microcomputer 44. In accordance with an A/D converted value, the microcomputer 44 can transmit a signal to the driver IC 47 through a communication section 46. The microcomputer 44 can input and monitor not only the boost voltage but also signals from the fuel pressure sensor and temperature sensor through the A/D converter 45. Further, the microcomputer 44 includes an input/output port 42 for driving an external load and monitoring an external signal.

The upper driver 52 in the fuel injection control circuit 27 includes a boost voltage driver 52a and a battery voltage driver 52b. The boost voltage driver 52a uses the boost voltage generated from the booster circuit 51 to drive a coil load 54. The battery voltage driver 52b uses the battery voltage generated from the battery 41 to drive the coil load 54.

Drive signals A and B of the driver drive section 48 in the driver IC 47 operate the upper driver 52 to supply a current to the coil load 54 such as the fuel injection valve 5 having an electromagnetic coil. Drive signal A triggers the boost voltage driver 52a based on the boost voltage. Drive signal B triggers the battery voltage driver 52b based on the battery voltage. Drive signal C of the driver drive section 48 operates the lower driver 53 so that a current from the coil load 54 flows to a ground potential.

At least either the upper driver 52 or the lower driver 53 includes a current detector and terminal voltage detector based, for instance, on a shunt resistor, and exercises driver drive control to detect and feed back the value of a current flowing to the driver and coil load 54. These functions can also be exercised to detect an overcurrent to the driver and a terminal short-circuited to a power supply terminal or a ground terminal.

In the first embodiment, the booster circuit 51, the upper driver 52, and the lower driver 53 are separate from the driver IC 47. Alternatively, however, these components may be incorporated in the driver IC 47. In other words, the driver IC 47 may be used as a driver or a pre-driver.

(3) Drive Waveforms

Figure 3:
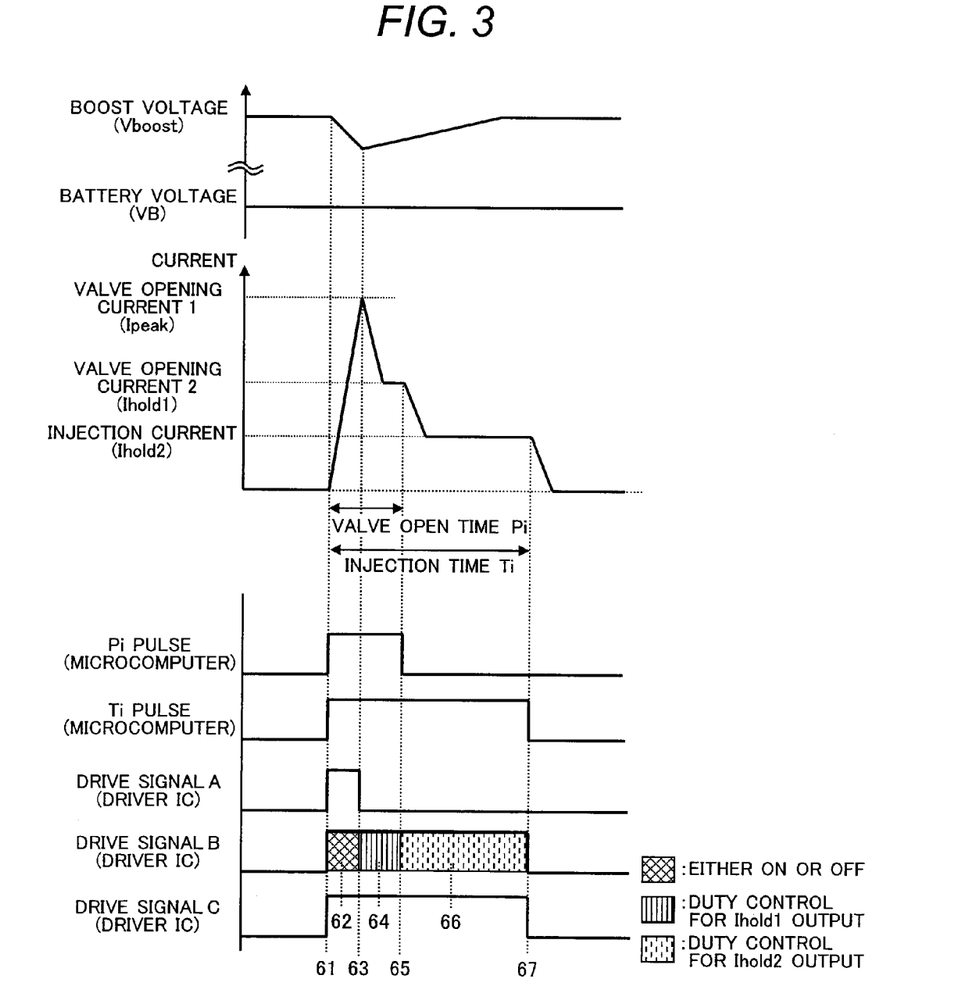
FIG. 3 is a waveform diagram illustrating drive waveforms for a coil load according to the first embodiment.

FIG. 3 is a waveform diagram illustrating the relationship between drive waveforms output from the driver drive section 48 and currents flowing to the coil load 54. The microcomputer 44 outputs a Pi pulse, which is a pulse signal for determining a valve open time, and a Ti pulse, which is a pulse signal for determining an injection time. The valve open time Pi and the injection time Ti are set in accordance with the characteristics of the coil load and fixed under normal conditions. The injection time Ti is generally set to be longer than the valve open time Pi.

Upon receipt of the Pi pulse and Ti pulse, the driver drive section 48 in the driver IC 47 turns on drive signals A, B, and C, transmits these signals to the upper driver 52 and lower driver 53, and starts to drive each driver (state 61). Under normal conditions where the circuit is driven by the boost voltage, which is set to be higher than the battery voltage, the circuit actuates even when drive signal B is not driven.

The present condition is allowed to continue so that the current increases to a predefined peak current value Ipeak (valve opening current 1) (state 62). Immediately after the current reaches the peak current value Ipeak, drive signal A is turned off so that the battery voltage duty-drives drive signal B (state 63). Subsequently, drive signal B is driven to maintain a predefined current Ihold1 (valve opening current 2) (state 64). The resultant state is maintained till the end of the valve open time Pi. Immediately after the end of the valve open time Pi is reached, the duty ratio of drive signal B is decreased to maintain a predefined current Ihold2 (injection current) (state 65).

The resultant state is maintained till the end of the injection time Ti (state 66). Immediately after the end of the injection time Ti is reached, drive signal B is turned off to terminate the driving operation (state 67). The same result can be obtained from the above operation even when drive signal A is extended to provide duty drive without using drive signal B in states 64 and 65.

The voltage waveforms in FIG. 3, which depict the boost voltage (Vboost) and battery voltage (VB), indicate that the boost voltage decreases when the boost signal is used with drive signal A turned on (state 62). The boost voltage can be monitored in the booster circuit drive section 50. When drive signal A is turned off after the current reaches the peak current value Ipeak (state 63), the boost voltage increases until it is restored to its setting. After the setting is reached, the boost voltage is maintained at the setting. If the boost voltage is also used to provide drive at Ihold1 and Ihold2, the boost voltage further decreases as it is used in the resultant state.

FIG. 3 indicates that the battery voltage is constant. The reason is that a decrease in the battery voltage is small as the battery's current capacity is large, and that the time required for the battery to recover its voltage is short and ignorable.

(4) Extension of Valve Open Time Pi

Figure 4:
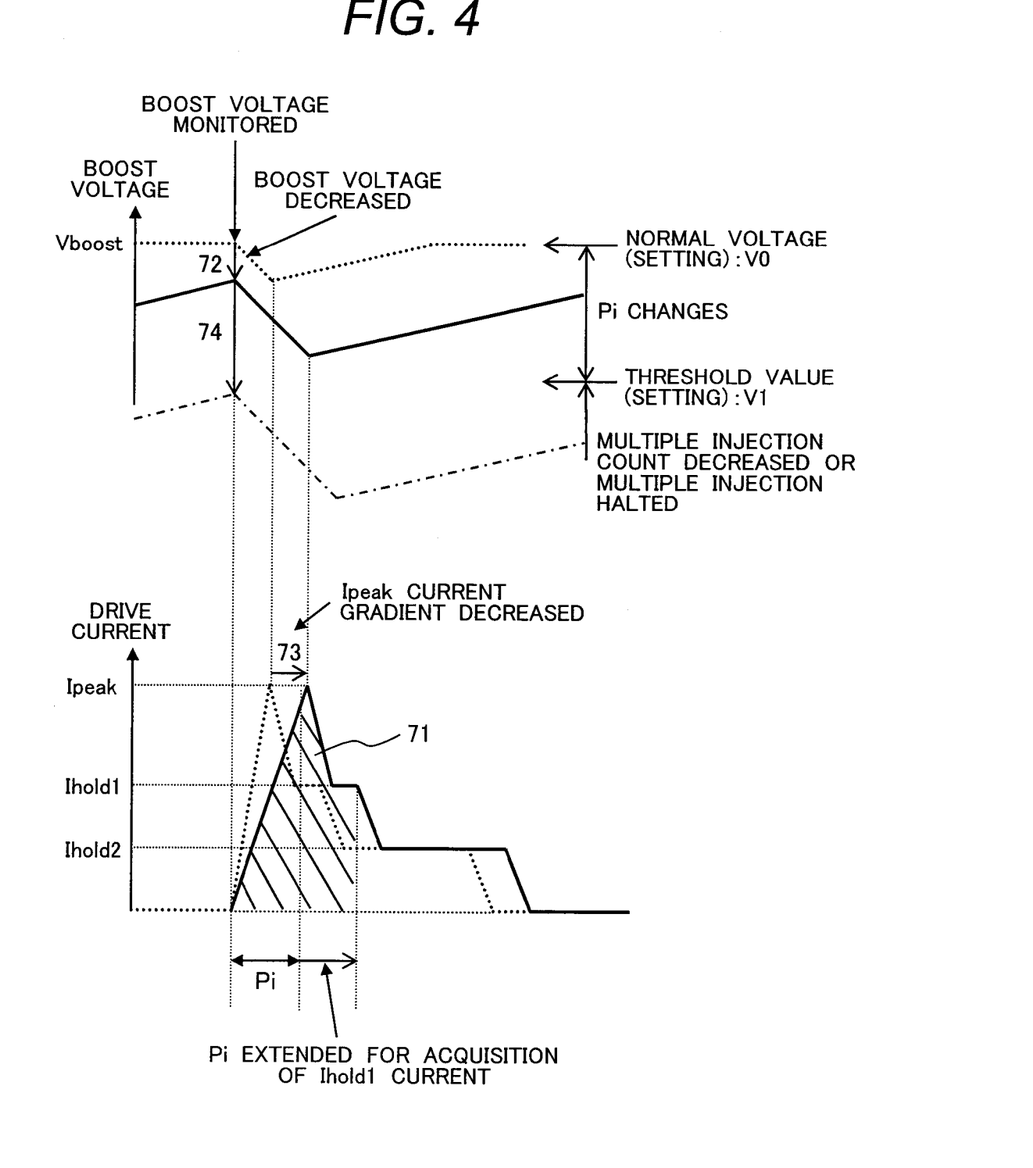
FIG. 4 is a waveform diagram illustrating a boost voltage and fuel injection current according to the first embodiment.

Waveforms in FIG. 4 indicate the relationship between the boost voltage generated by the booster circuit 51 according to the first embodiment and the current flowing in the coil load 54. As described with reference to FIG. 3, the boost voltage changes as indicated by a dotted line in the upper half of FIG. 4.

The coil load 54 is driven mainly by allowing the Ipeak current, Ihold1 current, and Ihold2 current to flow therein. The Ipeak current and Ihold1 current are used to open the fuel injection valve 5. The Ihold2 current is used to keep the fuel injection valve 5 open. The configuration described with reference to FIG. 3 is used to supply a current to the coil load 54. The lengths of the valve open time Pi and injection time Ti can be controlled by the microcomputer 44.

The boost voltage decreases when a current is supplied to the coil load 54. The boost voltage is fed back to the booster circuit drive section 50 to output a switching signal for the booster circuit 51. This resumes a boosting operation. When the use of the boost voltage stops, the boost voltage increases. When the boost voltage is restored to a predefined voltage V0, the booster circuit drive section 50 monitors the boost voltage and stops the switching signal for the booster circuit 51. When the boost voltage is restored to the predefined voltage V0 before the next injection, the next injection can be performed in the same manner.

However, if the number of injections per operation cycle is increased due, for instance, to multiple injection, it is conceivable that the boost voltage may not be restored to the predefined normal voltage V0 before the next injection. If the boost voltage is not restored to the predefined level in time as indicated by a solid line in the middle of FIG. 4 so that the boost voltage at the beginning of injection is lower than the predefined level V0 (state 72), the rise capacity of the current decreases to decrease the gradient of a drive current waveform (state 73).

When the gradient of the drive current is decreased, a valve opening operation is delayed so that the valve open time Pi ends before the Ipeak current is reached. In such an instance, valve opening characteristics degrade as adequate amounts of Ipeak current and Ihold1 current are not obtained for the valve open time Pi.

In the above situation, the present embodiment can obtain adequate amounts of Ipeak current and Ihold1 current by extending the valve open time Pi. Therefore, a subsequent requested injection can be performed properly even if it needs to be completed before the boost voltage is restored to the predefined level.

If the above-described multiple injection state continues for a prolonged period of time, the boost voltage further decreases (state 74), making it difficult to provide injection. Here, it is assumed that a setting V1 is used as a relevant threshold value. If the boost voltage prevailing at the beginning of injection is lower than V1 due to a further delay in the restoration of the boost voltage, the microcomputer 44 decreases the number of multiple injections or halts the multiple injection operation. Control is exercised in this manner to restore the boost voltage to V0 or a level higher than V1.

(5) Control Method

Figure 5:
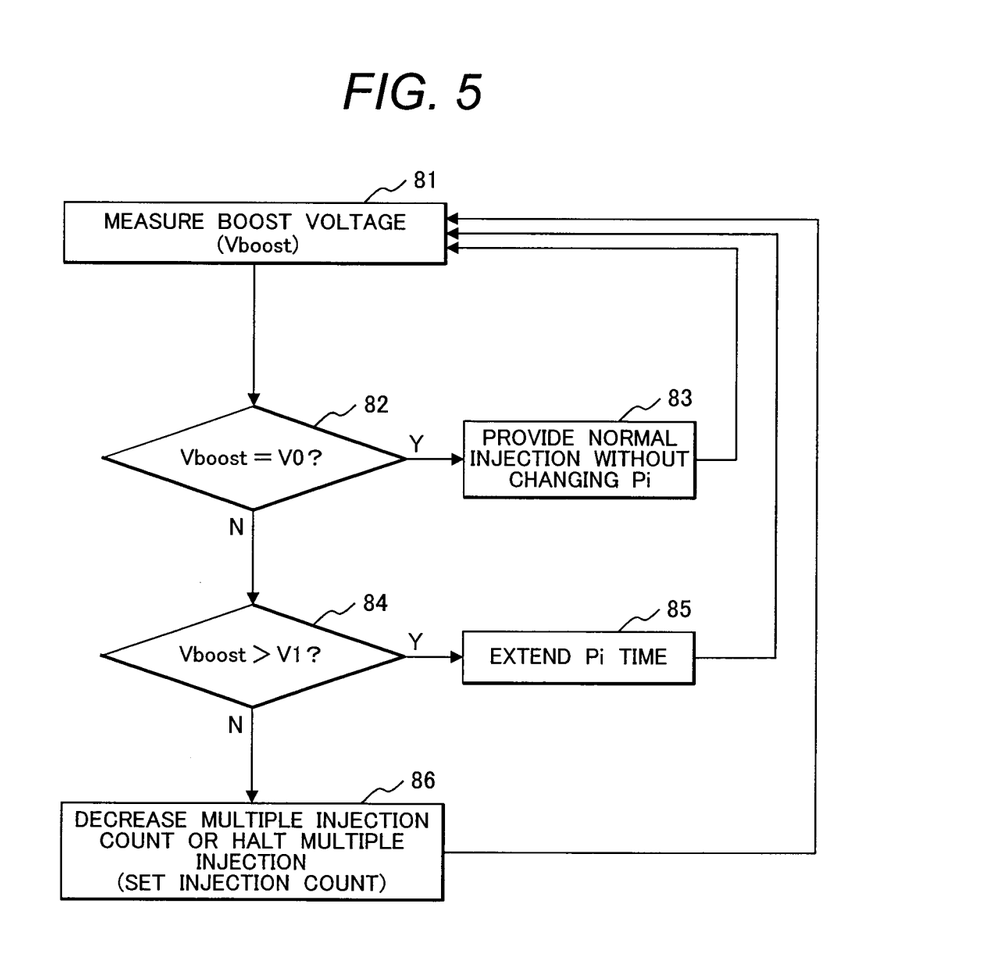
FIG. 5 is a flowchart illustrating a control method according to the first embodiment.

FIG. 5 is a flowchart illustrating a method of control that is exercised in situations indicated in FIG. 4. The boost voltage is measured before injection (state 81). The boost voltage is then checked to determine whether it is at the same level as the predefined normal voltage V0 indicated in FIG. 4 (state 82). If the boost voltage is at the same level as the predefined normal voltage V0, an injection operation is performed a requested number of times without changing the setting of the valve open time Pi (state 83).

If, on the other hand, the boost voltage is not at the same level as the predefined normal voltage V0, the boost voltage is checked to determine whether it is greater than the predefined threshold value V1 (state 84). If the boost voltage is greater than the predefined threshold value V1, the valve open time Pi is extended to perform an injection operation the requested number of times (state 85).

The valve open time Pi can be extended in any manner. However, an effective method is to provide constant fuel injection valve drive energy by ensuring that the area (71 in FIG. 4) enclosed by a current waveform during the valve open time Pi remains unchanged. As the gradient of the drive current waveform decreases in proportion to a decrease in the boost voltage, an alternative method is to extend the valve open time Pi in inverse proportion to the boost voltage monitored before injection (e.g., Pi→V0/Vboost×Pi). Another alternative method is to define extended settings of the valve open time Pi for various boost voltages by conducting a vehicle matching test.

The extended settings of the valve open time Pi may be expressed in the form of an equation and stored in the microcomputer 44. Alternatively, a table of the extended settings prepared for boost voltages monitored before injection may be stored in the microcomputer 44.

If the boost voltage monitored before injection is lowered below the threshold value V1, a decreased number of injections is set in a stepwise fashion without performing an injection operation the requested number of times (state 86). For example, if the monitored boost voltage is below the threshold value V1 in a situation where the requested number of injections is N, the number of injections is set to be N−1. Further, if the monitored boost voltage is below an even lower threshold value V2, the number of injections is set to be N−2. In any case, two or more threshold values equivalent to V1 may be set.

Second Embodiment

The present invention aims at providing as large a number of injections as possible even when the boost voltage is lowered. As such being the case, another effective method is to exercise multiple injection control by separately controlling the first injection and the subsequent injections. More specifically, at least the first injection is controlled in such a manner as to extend the valve open time Pi without regard to the boost voltage.

Meanwhile, the second and subsequent injections are controlled by monitoring the boost voltage immediately before injection as indicated in the flowchart of FIG. 5. For example, the second and subsequent injections may be controlled by extending the valve open time Pi if the boost voltage is between V1 and V0 (V1<Vboost<V0), or by halting an injection operation if the boost voltage is not higher than V1. This scheme provides at least one injection irrespective of voltage conditions.

Figure 6:
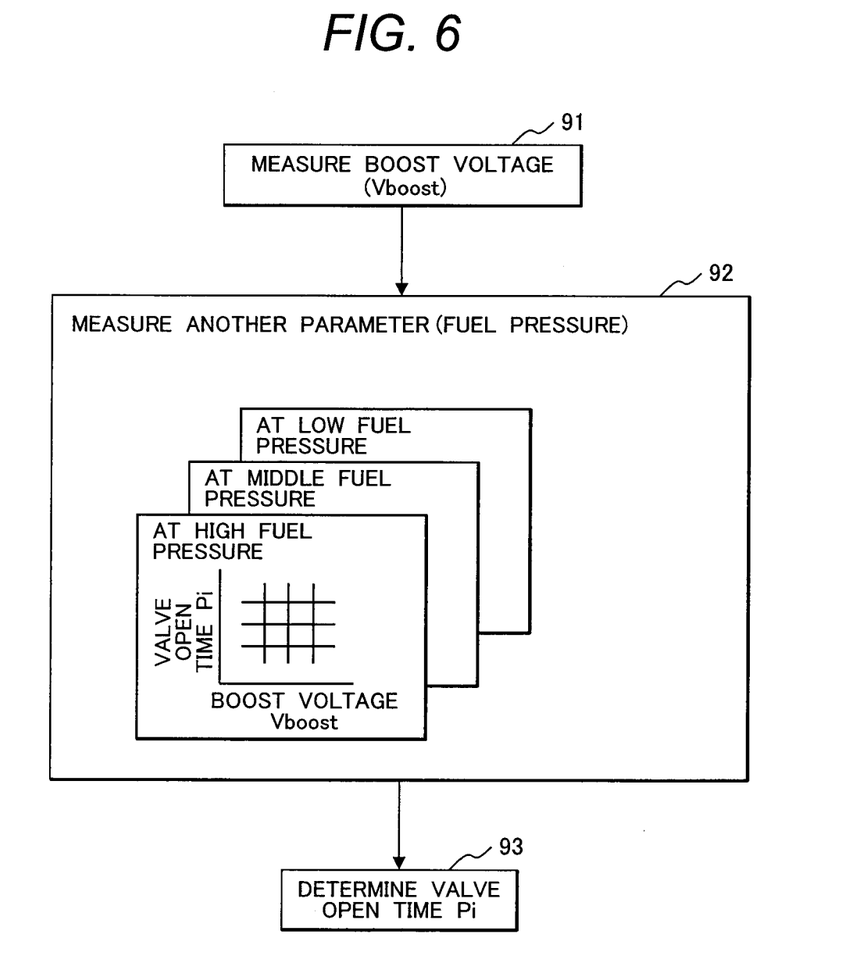
FIG. 6 is a schematic diagram illustrating a valve open time determination method according to the first embodiment or a second embodiment of the present invention.

FIG. 6 shows a scheme that is used in the first or second embodiment to determine the valve open time with respect to a measured boost voltage by using a table or equation stored in the microcomputer 44. The current waveform shown in FIG. 4 is mainly determined by a monitored boost voltage value. However, when the valve open time is to be calculated, a table or equation may be created by adding fuel injection parameters, such as fuel pressure, injection interval, and temperature, to the boost voltage.

When, for instance, the fuel pressure is to be added to the boost voltage as a fuel injection parameter, the boost voltage is first measured (state 91). Then, fuel pressure values monitored, for instance, by the A/D converter 45 in the microcomputer 44 are used to calculate the valve open time Pi from the relationship between the boost voltage Vboost and the valve open time Pi at low fuel pressure, medium fuel pressure, and high fuel pressure (state 92).

Eventually, the valve open time Pi is determined (state 93). In the above instance, the boost voltage measurement and the fuel pressure measurement may be made in reverse order. Similar control can also be exercised, for instance, by monitoring the temperature and injection interval in addition to the fuel pressure. Control can be exercised by using one or more parameters that affect the drive of the fuel injection system.

Figure 7:
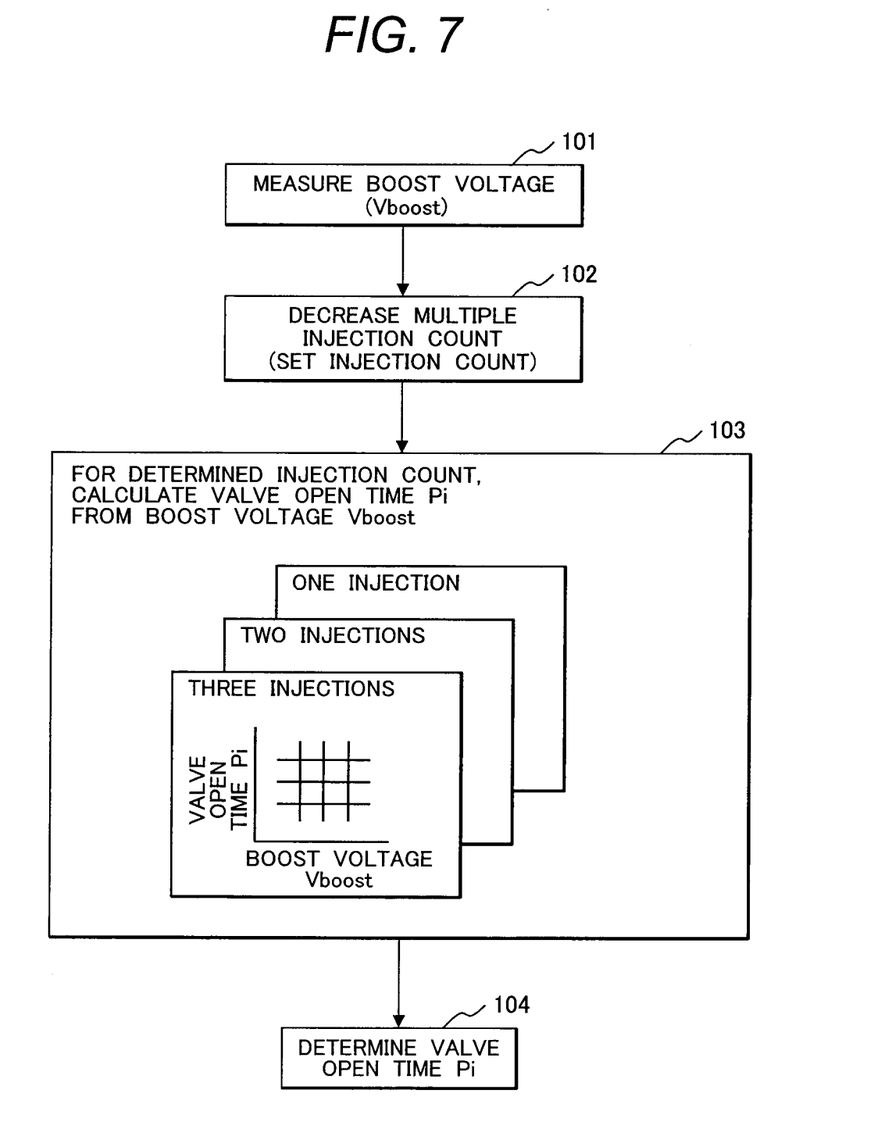
FIG. 7 is a schematic diagram illustrating another valve open time determination method according to the first embodiment or the second embodiment.

FIG. 7 is a schematic diagram illustrating a scheme that is used in the first or second embodiment to determine the valve open time with respect to the number of injections determined from a measured boost voltage by using a table or equation stored in the microcomputer 44. After the boost voltage is monitored (state 101), the number of multiple injections is decreased (state 102). The determined number of injections is then used as a parameter to calculate the valve open time Pi from the relationship between the boost voltage Vboost and the valve open time Pi (state 103). Eventually, the valve open time Pi is determined (state 104) to exercise control.

It should be understood by those skilled in the art that various modifications, combinations, sub-combinations, and alterations may occur depending on design requirements and other factors insofar as they are within the scope of the appended claims or the equivalents thereof.

What is claimed is:

1. An engine control unit for an internal-combustion engine driving a fuel injection valve electromagnetically to provide fuel injection multiple number of times per operation cycle to a combustion chamber of the internal-combustion engine, the engine control unit comprising:
   a microcomputer outputting a valve open time for opening the fuel injection valve and a injection time for injecting the fuel injection valve;
   a booster circuit that boosts the voltage of the battery to generate a boost voltage for the engine control unit;
   a voltage driver which controls the supply of an Ipeak current generated by the boost voltage, and an Ihold1 current generated by the boost voltage or the battery voltage smaller than the Ipeak current to the fuel injection valve according to the valve opening time, and controls the supply of an Ihold2 current generated by the battery voltage smaller than the Ihold1 current to the fuel injection valve according to the fuel injection; time, wherein
   the Ipeak current and the Ihold1 current are predetermined to open the fuel injection valve and the Ihold1 current is provided to complete the valve open action of the fuel injection valve, and the Ihold2 current is predetermined to hold the fuel injection valve open, and
   the valve open time is extended to control the providing current to the fuel injection valve to reach to the Ipeak current when the boost voltage of the booster circuit is below a predefined normal voltage V0.

2. An engine control unit for an internal-combustion engine driving a fuel injection valve electromagnetically to provide fuel injection multiple number of times per operation cycle to a combustion chamber of the internal-combustion engine, the engine control unit comprising:
   a microcomputer outputting a valve open time for opening the fuel injection valve and an injection time for injecting the fuel injection valve;
   a booster circuit that boosts the voltage of the battery to generate a boost voltage for the engine control unit;
   a voltage driver which controls the supply of an Ipeak current generated by the boost voltage and an Ihold1 current generated by the boost voltage or the battery voltage smaller than the Ipeak current to the fuel injection valve according to the valve opening time, and controls the supply of an Ihold2 current generated by the battery voltage smaller than the Ihold1 current to the fuel injection valve according to the fuel injection time, wherein
   the Ipeak current and the Ihold1 current are predetermined to open the fuel injection valve, and the Ihold2 current is predetermined to hold the fuel injection valve open,
   the valve open time is extended to control the providing current to the fuel injection valve to reach to the Ipeak current when the boost voltage of the booster circuit is below a predefined normal voltage V0, and
   the controller has a predefined threshold value V1 at which a control signal is transmitted to decrease the number of multiple injections of the fuel injection valve or halt the fuel injection valve when there is a further decrease in the boost voltage.

3. An engine control unit for an internal-combustion engine driving a fuel injection valve electromagnetically to provide fuel injection multiple number of times per operation cycle to a combustion chamber of the internal-combustion engine, the engine control unit comprising:

a microcomputer outputting a valve open time for opening the fuel injection valve and an injection time for injecting the fuel injection valve;

a booster circuit that boosts the voltage of the battery to generate a boost voltage for the engine control unit;

a voltage driver which controls the supply of an Ipeak current generated by the boost voltage and an Ihold1 current generated by the boost voltage and an Ihold1 current generated by the boost voltage or the battery voltage smaller than the Ipeak current to the fuel injection valve according to the valve opening time, and controls the supply of an Ihold2 current generated by the battery voltage smaller than the Ihold1 current to the fuel injection valve according to the fuel injection time, wherein the Ipeak current and the Ihold1 current are predetermined to open the fuel injection valve, and the Ihold2 current is predetermined to hold the fuel injection valve open, the valve open time is extended to control the providing current to the fuel injection valve to reach to the Ipeak current when the boost voltage of the booster circuit is below a predefined normal voltage V0, and the controller transmits a command signal concerning an injection time Ti, which starts simultaneously with the valve open time Pi of the fuel injection valve to keep the fuel injection valve open, to either the boost voltage driver or the battery voltage drive through the driver IC.

4. The engine control unit according to claim 3, wherein the controller includes a microcomputer.

5. An engine control unit for an internal-combustion engine driving a fuel injection valve electromagnetically to provide fuel injection multiple number of times per operation cycle to a combustion chamber of the internal-combustion engine, the engine control unit comprising:

a microcomputer outputting a valve open time for opening the fuel injection valve and an injection time for injecting the fuel injection valve;

a booster circuit that boosts the voltage of the battery to generate a boost voltage for the engine control unit;

a voltage driver which controls the supply of an Ipeak current generated by the boost voltage and an Ihold1 current generated by the boost voltage or the battery voltage smaller than the Ipeak current to the fuel injection valve according to the valve opening time, and controls the supply of an Ihold2 current generated by the battery voltage smaller than the Ihold1 current to the fuel injection valve according to the fuel injection time, wherein the Ipeak current and the Ihold1 current are predetermined to open the fuel injection valve, and the Ihold2 current is predetermined to hold the fuel injection valve open, the valve open time is extended to control the providing current to the fuel injection valve to reach to the Ipeak current when the boost voltage of the booster circuit is below a predefined normal voltage V0, and the engine control unit includes a fuel injection control circuit having the booster circuit, the boost voltage driver, the battery voltage drive and the driver IC.

6. An engine control unit for an internal-combustion engine driving a fuel injection valve electromagnetically to provide fuel injection multiple number of times per operation cycle to a combustion chamber of the internal-combustion engine, the engine control unit comprising:

a microcomputer outputting a valve open time for opening the fuel injection valve and an injection time for injecting the fuel injection valve;

a booster circuit that boosts the voltage of the battery to generate a boost voltage for the engine control unit;

a voltage driver which controls the supply of an Ipeak current generated by the boost voltage and an Ihold1 current generated by the boost voltage or the battery voltage smaller than the Ipeak current to the fuel injection valve according to the valve opening time, and controls the supply of an Ihold2 current generated by the battery voltage smaller than the Ihold1 current to the fuel injection valve according to the fuel injection time, wherein the Ipeak current and the Ihold1 current are predetermined to open the fuel injection valve, and the Ihold2 current is predetermined to hold the fuel injection valve open, the valve open time is extended to control the providing current to the fuel injection valve to reach to the Ipeak current when the boost voltage of the booster circuit is below a predefined normal voltage V0, and the driver IC includes a booster circuit drive section, which drives the booster circuit, and a driver drive section, which drives the boost voltage driver or the battery voltage driver.

7. A method of controlling an engine control unit for an internal-combustion engine driving a fuel injection valve electromagnetically to provide fuel injection multiple number of times per operation cycle to a combustion chamber of the internal-combustion engine, the method comprising the steps of:

outputting a valve open time for opening the fuel injection valve and a injection time for injecting the fuel injection valve;

causing the engine control unit to monitor a boost voltage obtained by boosting the voltage of the battery; controlling the supply of an Ipeak current generated by the boost voltage, and an Ihold1 current generated by the boost voltage or the battery voltage smaller than the Ipeak current to the fuel injection valve according to the valve opening time;

controlling the supply of an Ihold2 current generated by the battery voltage smaller than the Ihold1 current to the fuel injection valve according to the fuel injection time;

the Ipeak current and the Ihold1 current are predetermined to open the fuel injection valve, and the Ihold2 current is predetermined to hold the fuel injection valve open; and the valve open time is extended to control the providing current to the fuel injection valve to reach to the Ipeak current when the boost voltage is below a predefined normal voltage V0.

8. The method according to claim 7, further comprising the steps of:

performing a first injection sequence by extending the valve open time Pi of the fuel injection valve when the boost voltage is below the predefined normal voltage V0; and performing a second injection sequence and subsequent injection sequences by decreasing the number of multiple injections of the fuel injection valve or by halting the multiple injections of the fuel injection valve.

9. The method according to claim 7, further comprising the step of:

setting a boost voltage threshold value V1 at which the number of multiple injections of the fuel injection valve is decreased or the multiple injections of the fuel injection valve are halted when the boost voltage is below the predefined normal voltage.

10. The method according to claim 9, further comprising the step of:
    varying the boost voltage threshold value V1 when decreasing the number of multiple injections of the fuel injection valve or halting the multiple injections of the fuel injection valve.

11. The method according to claim 7, further comprising the step of:
    defining the timing of monitoring the boost voltage immediately before a fuel injection from the fuel injection valve.

12. The method according to claim 7, further comprising the steps of:
    monitoring at least one of internal-combustion engine fuel pressure, fuel injection valve injection interval, and internal-combustion engine temperature in addition to the boost voltage; and
    varying the valve open time Pi of the fuel injection valve in accordance with the monitored values.

13. The engine control unit according to claim 1, wherein the voltage driver further comprising a boost voltage driver which uses the boost voltage generated from the booster circuit to drive a load.

14. The engine control unit according to claim 13, wherein the voltage driver further comprising a battery voltage driver which uses the battery voltage generated from the battery to drive a load.

15. The engine control unit according to claim 1, wherein the extended valve open time Pi is provided such that an area enclosed by a current waveform of driving current of the fuel injection valve remains unchanged during the valve open time Pi.

16. An engine control unit for an internal-combustion engine driving a fuel injection valve electromagnetically to provide fuel injection multiple number of times per operation cycle to a combustion chamber of the internal-combustion engine, the engine control unit comprising:
    a microcomputer outputting a valve open time for opening the fuel injection valve and an injection time for injecting the fuel injection valve;
    a booster circuit that boosts the voltage of the battery to generate a boost voltage for the engine control unit;
    a voltage driver which controls the supply of an Ipeak current generated by the boost voltage and an Ihold1 current generated by the boost voltage or the battery voltage smaller than the Ipeak current to the fuel injection valve according to the valve opening time, and controls the supply of an Ihold2 current generated by the battery voltage smaller than the Ihold1 current to the fuel injection valve according to the fuel injection time, wherein
        the Ipeak current and the Ihold1 current are predetermined to open the fuel injection valve, and the Ihold2 current is predetermined to hold the fuel injection valve open; and
        the valve open time is extended to control the providing current to the fuel injection valve to reach to the Ipeak current when the boost voltage of the booster circuit is below a predefined normal voltage V0, and
        the extended valve open time Pi is provided in inverse proportion to the boost voltage monitored before injection.

* * * * *